United States Patent [19]
Jiang et al.

[11] Patent Number: 5,719,893
[45] Date of Patent: Feb. 17, 1998

[54] PASSIVATED VERTICAL CAVITY SURFACE EMITTING LASER

[75] Inventors: Wenbin Jiang, Phoenix; Paul Claisse, Gilbert; Michael S. Lebby, Apache Junction, all of Ariz.

[73] Assignee: Motorola, Inc., Schaumburg, Ill.

[21] Appl. No.: 682,473

[22] Filed: Jul. 17, 1996

[51] Int. Cl.$^6$ .................................................. H01S 3/19
[52] U.S. Cl. .................................................. 372/45; 372/96
[58] Field of Search .............................. 372/96, 44, 45, 372/46, 49

[56] References Cited

U.S. PATENT DOCUMENTS

| | | | |
|---|---|---|---|
| 4,178,564 | 12/1979 | Ladany et al. | 372/49 |
| 5,274,655 | 12/1993 | Shieh | 372/96 |

Primary Examiner—James W. Davie
Attorney, Agent, or Firm—Eugene A. Parsons

[57] ABSTRACT

A passivated vertical cavity surface emitting laser including a first stack of distributed Bragg reflectors disposed on the surface of a semiconductor substrate, a first cladding region disposed on the first stack, an active region disposed on the first cladding region, a second cladding region disposed on the active region, and a second stack of distributed Bragg reflectors disposed on the second cladding region. A passivation layer having an optical thickness of an integral multiple of approximately one half of the wavelength of emitted light is disposed on the vertical cavity surface emitting laser.

10 Claims, 2 Drawing Sheets

5,719,893

1

PASSIVATED VERTICAL CAVITY SURFACE EMITTING LASER

FIELD OF THE INVENTION

This invention relates, in general, to optical devices and, more particularly, to light emitting devices.

BACKGROUND OF THE INVENTION

Recently, interest has developed in a light emitting device called a vertical cavity surface emitting laser (VCSEL). VCSELs offer several potential advantages, such as feasibility of array formation, emission of light perpendicular to a processing surface, high volume manufacturability, and the like.

However, VCSELs are sensitive devices which require protection from physical and chemical damage. Presently, VCSELs are either not passivated or are passivated without any concern for preserving the VCSEL performance, thus jeopardizing their physical integrity and severely degrading their performance characteristics. As long as VCSELs remain susceptible to physical and chemical damage, VCSELs will present several disadvantages and problems to high volume manufacturing and wide spread industrial use.

It can be readily seen that conventional VCSELs have several disadvantages and problems, thus not enabling their manufacture in volume manufacturing applications. Therefore, a light emitting device and method for making same that protects the light emitting device from physical and chemical damage, simplifies the fabrication process, reduces cost, and improves reliability would be highly desirable.

SUMMARY OF THE INVENTION

The above problems and others are at least partially solved and the above purpose is realized in a passivated vertical cavity surface emitting laser including a vertical cavity surface emitting laser positioned on a semiconductor substrate and including a first stack of distributed Bragg reflectors disposed on the surface of the semiconductor substrate, a first cladding region disposed on the first stack of distributed Bragg reflectors, an active region disposed on the first cladding region, a second cladding region disposed on the active region, and a second stack of distributed Bragg reflectors disposed on the second cladding region. The vertical cavity surface emitting laser is designed to emit light of a selected wavelength and a passivation layer is disposed on the vertical cavity surface emitting laser, the passivation layer having an optical thickness of an integral multiple of approximately one half of the wavelength of the emitted light, to passivate and protect the laser.

DESCRIPTION OF THE PREFERRED EMBODIMENTS

Figure 1:
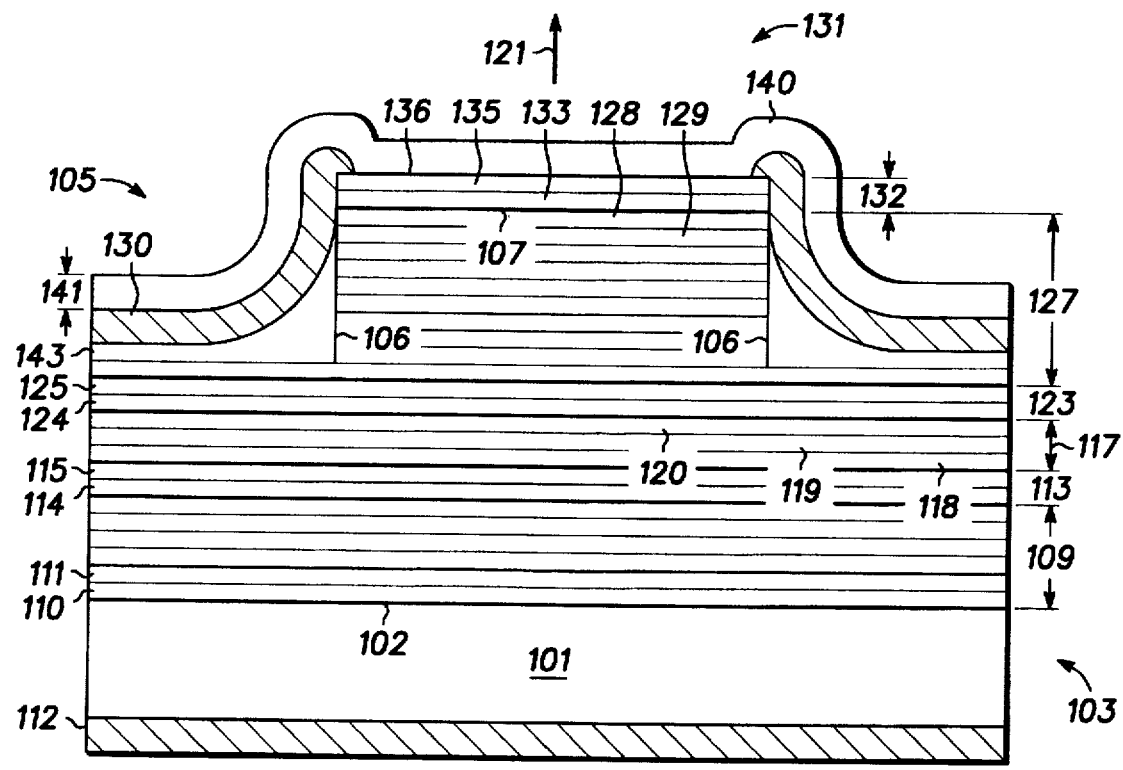
FIG. 1 is a simplified sectional view of a ridge VCSEL embodying the present invention.
Figure 2:
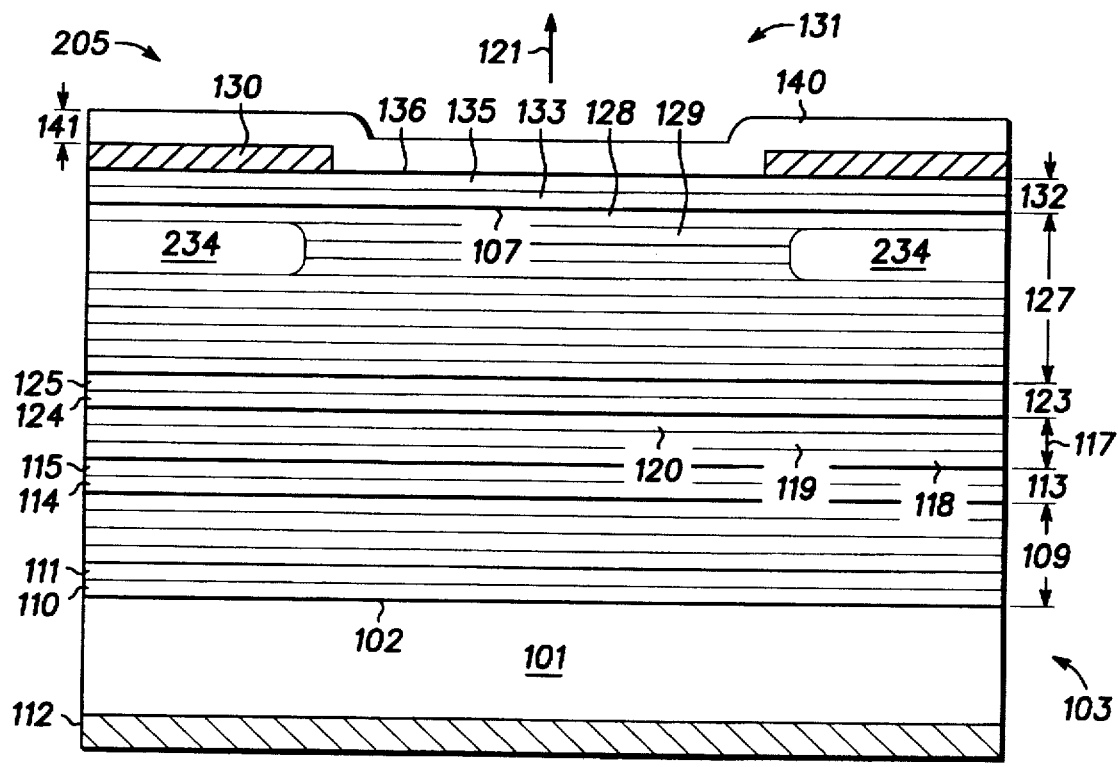
FIG. 2 is a simplified sectional view of a planar VCSEL embodying the present invention.

FIGS. 1 and 2 illustrate light emitting device having a light, represented by an arrow 121, being emitted therefrom, with FIG. 1 illustrating a ridge VCSEL 105 and with FIG. 2 illustrating a planar VCSEL 205, in accordance with the present invention. As shown in FIGS. 1 and 2, both ridge VCSEL 105 and planar VCSEL 205 include a semiconductor substrate 101 having a surface 102. A first stack 109 of distributed Bragg reflectors (DBRs) with a plurality of alternating layers, illustrated by a layer 110 and a layer 111, is positioned on surface 102 of substrate 101. A first cladding region 113, including a layer 114 that is doped and a layer 115 that is undoped, is positioned on stack 109. An active region 117, including a barrier layer 118, a quantum well layer 119, and a barrier layer 120, is positioned on first cladding region 113. A second cladding region 123, including a layer 124 that is undoped and a layer 125 that is doped, is positioned on active region 117. A second stack 127 of distributed Bragg reflectors having a plurality of alternating layers, illustrated by a layer 128 and a layer 129, is positioned on second cladding region 123. A contact region 132, including a layer 133 and a layer 135 with a surface 136, is positioned on second stack 127. A conductive layer 130, having a passivation layer 140, with a thickness 141, in overlying relationship thereto, is positioned at least partially on surface 136 of contact region 132. As illustrated in FIG. 1, ridge VCSEL 105 is shown to also include a ridge defined by a sidewall 106, a surface 107, and a surrounding layer 143, whereas FIG. 2 shows planar VCSEL 205 including a damaged region 234.

It should be understood that FIGS. 1 and 2 are simplified illustrations and that many elements have been purposefully omitted, or simplified, to more clearly illustrate the present invention. Further, it should be noted that FIGS. 1 and 2 are sectional views, and light emitting device 100 extends into an out of the figure as well as to the right and left. Thus, the light emitting device can be used to illustrate either an array of light emitting devices or a single device. It should be further understood that ridge VCSEL 105 and planar VCSEL 205 can be formed such that the emitted light represented by arrow 121 can be shaped into a variety of geometric patterns, such as a square, a circle, a triangle, or the like.

Generally, ridge VCSEL 105 and planar VCSEL 205 are fabricated on any suitable semiconductor substrate 101, such as gallium arsenide, indium phosphide, or the like where semiconductor substrate 101 provides surface 102. Stack 109 of distributed Bragg reflectors, cladding region 113, active region 117, cladding region 123, stack 127 of distributed Bragg reflectors, and contact region 132 are epitaxially deposited on surface 102 by any suitable method, such as molecular beam epitaxy (MBE), metal-organic chemical vapor deposition (MOCVD), or the like.

As shown in FIGS. 1 and 2, a contact region 112 is disposed on a bottom side of semiconductor substrate 101. Contact region 112 provides an electrical contact for the light emitting device. With contact region 112 being disposed on the bottom surface of semiconductor substrate 101, semiconductor substrate 101 become part of an electrical path to stack 109 of distributed Bragg reflectors. Generally, contact region 112 is made by any well-known method in the art, such as sputtering or evaporating a conductive metal onto the bottom surface followed by an anneal, thereby electrically coupling stack 109 of distributed Bragg reflectors to contact region 112 through semiconductor substrate 101. However, it should be noted that other alternatives or methods are available for electrically coupling stack 109 of distributed Bragg reflectors to a voltage source. For example, stack 109 of distributed Bragg reflectors can be directly coupled by exposing a portion of stack 109 of distributed Bragg reflectors, metalizing that exposed portion, and subsequently electrically bonding to that metalized portion. Also, contact region 112 can be positioned on an exposed portion (not shown) of upper surface 102 of substrate 101 adjacent stack 109, if desired.

Generally, stacks 109 and 127 of distributed Bragg reflectors are made of a plurality of alternating layers, illustrated by layers 110 and 111 and layers 128 and 129, respectively. The plurality of alternating layers of stacks 109 and 127 provide material layers having alternating refractive indexes, thereby enabling photons generated in active region 117 to be reflected and subsequently emitted as light (arrow 121). The alternating layers are made of any suitable materials such as aluminum gallium arsenide (AlGaAs) having varying concentrations or amounts of aluminum and gallium, indium aluminum gallium phosphide (InAlGaP) having varying concentrations or amounts of aluminum and gallium, and the like. However, in a preferred embodiment of the present invention, stacks 109 and 127 are made of aluminum gallium arsenide having alternating concentrations of aluminum and gallium. For example, layers 110 and 111 are made of $Al_{(0.15)}Ga_{(0.85)}As/Al_{(0.80)}Ga_{(0.20)}As$, respectively and layers 129 and 128 are made of $Al_{(0.80)}Ga_{(0.20)}As/Al_{(0.15)}Ga_{(0.85)}As$, respectively. While specific concentrations have been given in this example, it should be understood that these concentrations are only examples and that these concentrations can range twenty five percent around the preferred concentrations.

Stacks 109 and 127 typically are doped with any suitable n-type dopant and p-type dopant, respectively. Generally, any suitable n-type dopant, such as selenium (Se), silicon (Si), or the like or any suitable p-type dopant, such as carbon (C), beryllium (Be), or the like can be used. Concentrations of these dopants can range from 1E15 $cm^{-3}$ to 1E21 $cm^{-3}$, with a preferred range from 1E16 $cm^{-3}$ to 1E20 $cm^{-3}$ and a nominal range from 1E17 $cm^{-3}$ to 1E19 $cm^{-3}$, with a nominal value of 1E18 $cm^{-3}$.

The pluralities of alternating layers, illustrated by layers 110 and 111 and layers 128 and 129 in stacks 109 and 127 can have any suitable number of alternating pairs. That is, with layers 110 and 111 being one alternating pair and with layers 128 and 129 being another alternating pair, the specific number of alternating pairs can be any suitable number. Generally, the number of alternating pairs can range from twenty pairs to sixty pairs, with a preferred number ranging from twenty-five pairs to fifty-five pairs, and a nominal number ranging from 30 pairs to 45 pairs. However, in a preferred embodiment of the present invention and with the light emitting device being tuned to emit light (arrow 121) at 850 nanometers, stacks 109 and 127 have forty and 28 pairs of alternating layers, respectively. Thicknesses of the alternating layers, illustrated by layers 10 and 111 and layers 128 and 129, are determined and adjusted in accordance to the wavelength of light (arrow 121) that is emitted from the light emitting device.

Generally, layers 114 and 115 of cladding region 113 and layers 124 and 125 of cladding region 123 are made of the same materials as stacks 109 and 127. For example and in accordance with the preferred embodiment of the present invention, layers 114, 115, 124, and 125 are made of aluminum gallium arsenide. However, layers 115 and 124 are undoped, whereas layer 114 is doped with a corresponding dopant as in stack 109 but a varying or matching concentration and layer 125 is doped with a corresponding dopant as in stack 127 but a varying or matching concentration. More specifically, with stacks 109 and 127 including alternating layers of $Al_{(0.15)}Ga_{(0.85)}As/Al_{(0.80)}Ga_{(0.20)}As$, layers 114 and 125 are made of $Al_{(0.5)}Ga_{(0.5)}As$ and layers 115 and 124 are made of $Al_{(0.3)}Ga_{(0.7)}As$.

Generally, when discussing the thickness of the various components the measurement refers to the optical thickness. The optical thickness of layers 114, 115, 124, and 125 is determined in accordance with well-known methods in the art which utilize as a measure a wavelength of the light (arrow 121) being emitted. Thus, specific optical thicknesses of layers 114, 115, 124, and 125 will vary in accordance with the wavelength of light being emitted from the light emitting device.

As shown in FIGS. 1 and 2, active region 117 includes barrier layer 118 and barrier layer 120 with quantum well layer 119 being disposed therebetween. However, it should be understood that active region 117 is shown in its simplest form and that active region 117 can include a plurality of barrier layers and a plurality of quantum well layers. Quantum well layer 119 and barrier layers 118 and 120 are made of any suitable material, such as gallium arsenide, aluminum gallium arsenide, indium gallium phosphide, indium aluminum gallium phosphide, or the like; however, in a preferred embodiment of the present invention, quantum well layer 119 is made of gallium arsenide and barrier layers 118 and 120 are made of aluminum gallium arsenide (e.g., $Al_{(0.3)}Ga_{(0.7)}As$). Quantum well layer 119 and barrier layers 118 and 120 can be made to have any suitable thickness; however, in a preferred embodiment of the present invention, thicknesses of quantum well layer 119 and barrier layer 118 and 120 can range from 50 Angstroms to 150 Angstroms, with a preferred range from 75 Angstroms to 125 Angstroms, and a nominal value of 100 Angstroms. However, it should be understood that generally active region 117 and cladding regions 113 and 123 have a total optical thickness of one wavelength of the emitted light or a multiple thereof.

As shown in FIGS. 1 and 2, contact region 132 includes layers 133 and 135, and provides an electrical contact to stack 127 of distributed Bragg reflectors. Generally, layers 133 and 135 are made of the same materials as stacks 109 and 127. For example and in accordance with the preferred embodiment of the present invention, layers 133 and 135 are made of aluminum gallium arsenide with layer 133 being $Al_{(0.8)}Ga_{(0.2)}As$ and layer 135 being $Al_{(0.15)}Ga_{(0.85)}As$. However, layers 133 and 135 are highly doped with the doping concentration for layer 133 ranging from 1E15 to 1E21 $cm^{-3}$, with a preferred range from 1E16 to 1E20 $cm^{-3}$, and a nominal range from 1E17 to 1E19 $cm^{-3}$, and with the doping concentration for layer 135 ranging from 1E17 to 1E21 $cm^{-3}$, with a preferred range from 1E18 to 1E20 $cm^{-3}$, with a nominal range from 1E19 to 1E20 $cm^{-3}$, and a nominal value of 1E19 $cm^{-3}$.

Referring now specifically to ridge VCSEL 105 in FIG. 1, with the epitaxial depositions being completed, stack 109 of distributed Bragg reflectors is patterned to form the ridge or mesa. Generally, the ridge is made by any suitable wellknown method in the art, such as photolithography, etching, lift-off, any combination thereof, or the like. By defining the ridge in stack 109 of distributed Bragg reflectors, an optical path is defined in stack 109 that reflects and guides light formed in active region 117, as well as the operating current.

Referring now to FIG. 2, once the epitaxial depositions are complete, an ion implant mask (not shown) is formed on stack 109 of distributed Bragg reflectors. The ion implant mask is fabricated by any suitable well-known method in the art such as photolithography, deposition, etching, any combination thereof, or the like. The ion implant mask provides openings which expose portions of stack 109 while covering or protecting other portions of stack 109. Typically, the ion implant mask is shaped in a dot pattern, i.e., islands of the ion implant mask are placed on stack 109. Once the ion implant mask is formed, stack 109 is ion implanted by any suitable well-known method in the art. Generally, ion implantation injects ions through the exposed surface of stack 109, while the ion implant mask protects and does not allow the ions to penetrate into the unexposed surface of stack 109. When the ions pass through the exposed surface and come to rest in stack 109, they cause damage in the crystal lattice structure resulting in high resistance damaged areas 234. Because damaged areas 234 do not conduct current as readily as where there is no damage, current is confined to areas where there is no damage.

Once ridge VCSEL 105 or planar VCSEL 205 have been formed, a series of depositions and patterning steps are performed to fabricate layer 143 (only FIG. 1), 130, and 140. Generally, these depositions and patterning steps are performed by any suitable well-known method or combination of methods in the art, such as chemical vapor deposition (CVD), plasma enhanced chemical vapor deposition (PECVD), sputtering, photolithography, lift-off, etching, and the like.

Referring to FIG. 1, layer 127 is made of any suitable dielectric material, such as nitride, oxynitride, oxide, or the like. Layer 143 is deposited so as to overlie structures previously described. Layer 127 is then patterned to expose surface 136 of the ridge while the remaining portions of layer 143 passivate or insulate structures where layer 143 has not been removed as shown in FIG. 1.

Referring to both FIGS. 1 and 2, conductive layer 130 is then deposited on the structures. Conductive layer 130 is made of any suitable electrically conductive materials or alloys, such as titanium tungsten, titanium gold, gold, aluminum, silver, or the like. Conductive layer 130 is subsequently patterned to expose surface 136 of contact region 132, thus conductive layer 130 defines an opening or aperture 131 which exposes surface 136, as well as an electrical contact which electrically couples conductive layer 130 to stack 127 of distributed Bragg reflectors.

Passivation layer 140 is subsequently deposited on ridge VCSEL 105 and planar VCSEL 205 covering surface 136. Passivation layer 140 is made of any suitable insulative material, such as oxide, nitride, oxynitride, or the like. Passivation layer 140 is deposited on contact region 132 by any suitable method such as a spin-on process, a chemical vapor deposition (CVD) process, e.g., plasma enhanced chemical vapor deposition (PECVD), or the like. Thickness 141 of passivation layer 140 is determined by the wavelength of light (arrow 121) being emitted, the optical thickness in this example being one half the wavelength of emitted light (arrow 121). For example, if the emitted light has a wavelength of 670 nanometers, the thickness of passivation layer 140 would be 335 nanometers. By depositing passivation layer 140 over aperture 131, light emitting device 100 is mechanically and chemically protected or passivated while allowing light to be emitted.

Figure 3:
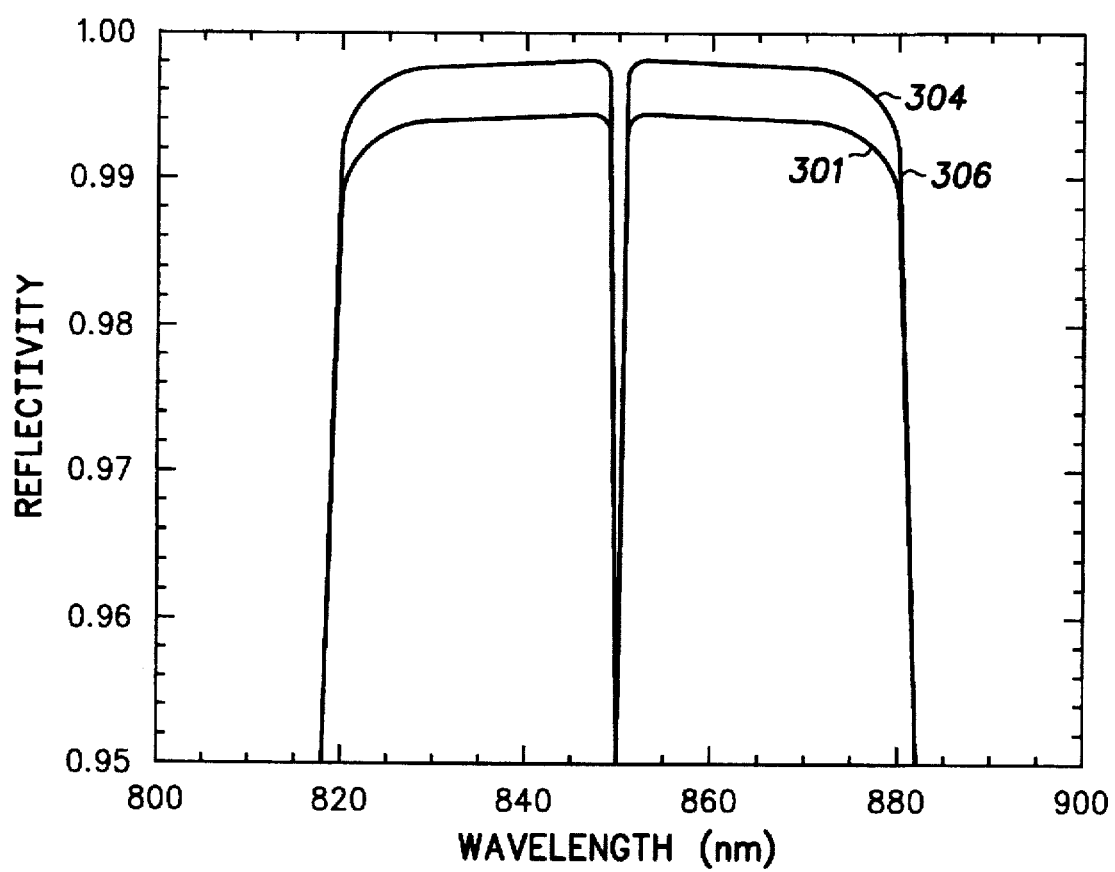
FIG. 3 is a simplified graph illustrating reflectivity versus wavelength of a stack of distributed Bragg reflectors having either no passivation layer or passivation layers with thicknesses of either one quarter wavelength or one half wavelength of a light being emitted.

FIG. 3 is a simplified graph illustrating reflectivity of stack 127 of distributed Bragg reflectors versus the wavelength of emitted light from light emitting device 100. As shown in FIG. 3, reflectivity ranges from 1 (100 percent) to 0.95 (95 percent) with wavelength ranging from 800 nanometers to 900 nanometers. Specifically, the graph of FIG. 3 illustrates a reflectivity versus wavelength curve 304 for stack 127 having no passivation layer, a reflectivity versus wavelength curve 301 for stack 127 having passivation layer 140 with optical thickness 141 being set at one quarter wavelength of the light being emitted, and a reflectivity versus wavelength curve 306 for stack 127 having passivation layer 140 with optical thickness 141 being set at one half wavelength of the light being emitted.

Curve 306 completely overlaps curve 304, thereby showing no difference in reflectivity between stack 127 having passivation layer 140 with an optical thickness 141 of one half wavelength of emitted light 121 and having no passivation layer 140. Thus, curve 304 preserves the reflectivity of stack 127, while curve 301 (quarter wavelength thick passivation layer) shows an 0.2 percent reduction in reflectivity. To compensate for the reflectivity reduction due to the quarter wavelength optical thickness of passivation layer 140, many more alternating layers would have to be added to stack 127, which extra layers will adversely increase device resistance and effective intracavity absorption loss. To this end, curve 304 makes it clear that half wavelength thick passivation should be utilized to preserve the originally designed performance of VCSEL 100.

By now it should be appreciated that a light emitting device and method of fabrication have been disclosed. The light emitting device includes a passivation layer which protects the light emitting device from physical and chemical damage, thereby maintaining high performance levels, as well as increasing the life time of the device. Additionally, since the passivation layer is integrated in the process flow of the light emitting device, the light emitting device is highly manufacturable, thus reducing overall costs and allowing significant improvements in reliability and quality.

While we have shown and described specific embodiments of the present invention, further modifications and improvements will occur to those skilled in the art. We desire it to be understood, therefore, that this invention is not limited to the particular forms shown and we intend in the appended claims to cover all modification that do not depart from the spirit and scope of this invention.

What is claimed is:

1. A passivated vertical cavity surface emitting laser comprising:

a semiconductor substrate having a surface;

a vertical cavity surface emitting laser including a first stack of distributed Bragg reflectors disposed on the surface of the semiconductor substrate, a first cladding region disposed on the first stack of distributed Bragg reflectors, an active region disposed on the first cladding region, a second cladding region disposed on the active region, a second stack of distributed Bragg reflectors disposed on the second cladding region, the vertical cavity surface emitting laser emitting light of a selected wavelength; and a passivation layer disposed on the vertical cavity surface emitting laser, the passivation layer having an optical thickness of an integral multiple of approximately one half of the wavelength of emitted light.

2. A passivated vertical cavity surface emitting laser as claimed in claim 1 wherein the passivation layer is a dielectric material.

3. A passivated vertical cavity surface emitting laser as claimed in claim 2 wherein the passivation layer is a silicon dioxide material.

4. A passivated vertical cavity surface emitting laser as claimed in claim 2 wherein the passivation layer is silicon nitride material.

5. A passivated vertical cavity surface emitting laser as claimed in claim 1 including a contact region disposed on the second stack of distributed Bragg reflectors.

6. A passivated vertical cavity surface emitting laser as claimed in claim 5 wherein the contact region includes a first layer and a second layer.

7. A passivated vertical cavity surface emitting laser comprising:

a semiconductor substrate having a surface;

a first stack of distributed Bragg reflectors disposed on the surface of the semiconductor substrate having a first plurality of alternating layers where the first plurality of alternating layers differ in refractive indexes;

a first cladding region disposed on the first distributed Bragg reflectors, the first cladding region includes a first doped layer and a first undoped layer with the first doped layer being disposed on the first stack of distributed Bragg reflectors and the first undoped layer being disposed on the first doped layer;

an active region disposed on the first cladding region, wherein the active region includes a quantum well and a first barrier region and a second barrier region with the quantum well positioned between the first barrier region and the second barrier region;

a second cladding region disposed on the active region, wherein the first cladding region includes a second doped layer and a second undoped layer with the second undoped layer being disposed on the active region and the second doped layer being disposed on the second undoped layer;

a second stack of distributed Bragg reflectors disposed on the second cladding region having a second plurality of alternating layers where the second plurality alternating layers differ in refractive indexes;

a contact region disposed on the second stack of distributed Bragg reflectors where the contact region includes a third layer and a fourth layer; and a passivation layer having a first layer and a second layer disposed on the contact region with the passivation layer having a thickness on the order of an integral multiple of one half wavelengths of a light emitted from the vertical cavity surface emitting laser, thereby protecting the vertical cavity surface emitting laser.

8. A passivated vertical cavity surface emitting laser as claimed in claim 7 wherein the passivation layer is a dielectric material.

9. A passivated vertical cavity surface emitting laser as claimed in claim 8 wherein the dielectric material is a silicon dioxide material.

10. A passivated vertical cavity surface emitting laser as claimed in claim 8 wherein the dielectric material is a silicon nitride material.

* * * * *